(12) United States Patent
Shimada et al.

(10) Patent No.: US 7,800,917 B2
(45) Date of Patent: Sep. 21, 2010

(54) PRINTED WIRING BOARD

(75) Inventors: Hiroshi Shimada, Yokohama (JP);
Shigeru Michiwaki, Yokohama (JP);
Kazuo Shishime, Yokohama (JP)

(73) Assignee: Meiko Electronics Co., Ltd., Ayase-shi (JP)

( * ) Notice: Subject to any disclaimer, the term of this patent is extended or adjusted under 35 U.S.C. 154(b) by 1027 days.

(21) Appl. No.: 11/491,604

(22) Filed: Jul. 24, 2006

(65) Prior Publication Data
US 2007/0025091 A1    Feb. 1, 2007

(30) Foreign Application Priority Data
Jul. 29, 2005    (JP) ............................. 2005-221702

(51) Int. Cl.
*H05K 1/11*    (2006.01)
*H05K 1/14*    (2006.01)

(52) U.S. Cl. ..................... 361/795; 361/794; 174/258; 174/262

(58) Field of Classification Search ......... 174/258–268; 361/792–795
See application file for complete search history.

(56) References Cited

U.S. PATENT DOCUMENTS

| | | | |
|---|---|---|---|
| 5,589,255 A * | 12/1996 | Enomoto et al. | 442/149 |
| 6,010,768 A * | 1/2000 | Yasue et al. | 428/209 |
| 7,071,424 B1 * | 7/2006 | Shirai et al. | 174/263 |

FOREIGN PATENT DOCUMENTS

| | | |
|---|---|---|
| JP | 7-188935 A | 7/1995 |
| JP | 11-172457 A | 6/1999 |
| JP | 2000-036659 | 2/2000 |
| JP | 2005-086164 | 3/2005 |

OTHER PUBLICATIONS

Japanese Office Action dated Apr. 28, 2010 and English translation thereof in counterpart Japanese Application No. 2005-221702.

* cited by examiner

*Primary Examiner*—Tuan T Dinh
(74) *Attorney, Agent, or Firm*—Frishauf, Holtz, Goodman & Chick, P.C.

(57) ABSTRACT

A printed wiring board has a first wiring layer formed at least on one surface of an insulative substrate, an insulating layer formed as covering the first wiring layer, and a second wiring layer formed on the insulating layer. The insulating layer is formed of a cured insulative sheet made of a high-stiff sheet-type reinforcing material containing resin. The first and second wiring layers are electrically connected to each other through at least one hole having a bottom. The second wiring layer is united with the insulating layer at an interface thereof with a conductive material of the second wiring layer injected into concave sections provided on the interface. Another printed wiring board has an insulative substrate having a first surface and a second surface, a first insulating layer and a second insulating layer formed on the first surface and the second surface, respectively, and a first wiring layer formed on the first insulating layer and a second wiring layer formed on the second insulating layer. The first and second wiring layers are electrically connected to each other via at least one through hole. The first wiring layer is united with the first insulating layer at an interface thereof with a conductive material of the first wiring layer injected into concave sections provided on the interface. The second wiring layer is united with the second insulating layer at an interface thereof with a conductive material of the first wiring layer injected into concave sections provided on the interface.

2 Claims, 9 Drawing Sheets

PRINTED WIRING BOARD

CROSS-REFERENCE TO RELATED APPLICATIONS

This application is based on and claims the benefit of priority from the prior Japanese Patent Application No. 2005-221702 filed on Jul. 29, 2005, the entire contents of which are incorporated herein by reference.

BACKGROUND OF THE INVENTION

The present invention relates to a printed wiring board and a method producing such a printed circuit.

Known printed wiring boards are produced by a method, for example, disclosed in Japanese Unexamined Patent Publication No. 2005-86164 (referred to as document 1, hereinafter).

The method disclosed in the document 1 is as follows: Prepared is a core substrate containing glass cloth. First and second wiring layers are formed on both sides of the core substrate and connected to each other through interstitial via holes (IVH). A B-staged insulative sheet containing glass cloth and copper foil are placed in this order on each wiring layer and laminated by thermal press. The laminated and cured insulative sheet is turned into an insulating layer.

The copper foil is then selectively etched to have openings for via holes. The portions of the insulating layer that correspond to the openings are removed by laser processing to have the via holes, followed by coating of a plated layer over the inner wall of each via hole and also the copper foil.

The plated layer and the copper foil are selectively removed by subtractive etching, a known technique to selectively etch a conductive layer to form a wiring layer. The etching process forms a third wiring layer on the first wiring layer connected to each other through the via holes and also a fourth wiring layer on the second wiring layer connected to each other through the via holes, thus providing a known printed wiring board.

Generally, thinner printed wiring boards suffer from lower stiffness. The known printed wiring board produced by subtractive etching, however, enjoys higher stiffness than those having insulating layers made of resin only, thanks to glass cloth contained in the core substrate and each insulating layer.

Thus, the known printed wiring board having the high-stiff glass cloth coated over the core substrate and each insulating layer is thought to be advantageous in achieving thinner structures.

Each conductive layer in the known printed wiring board is, however, relatively thick due to its dual-layer structure of the copper foil and the plated layer. It is also well known that subtractive etching causes difficulty in forming a finer wiring pattern on a thicker conductive layer.

There is thus demand for improvements in production of multilayer build-up wiring boards, such as the known one disclosed in the document 1, for finer and denser wiring patterns.

A method for achieving such finer and denser wiring patterns is disclosed in Japanese Unexamined Patent Publication No. 2000-36659 (referred to as document 2, hereinafter).

The method disclosed in the document 2 is as follows: Copper foil coated over an insulating layer and having via holes formed therethrough is completely etched away, to expose the insulating layer. A plated layer is formed on the exposed insulating layer by semi-additive processing, a known technique for forming a wiring layer by selective electroplating. The plated layer is used as the third wiring layer and also the fourth wiring layer (corresponding to those discussed above), after subjected to necessary processing steps. The third and fourth wiring layers formed in this way have a singly-layer structure because of complete etching removal of copper foil, thus becoming thinner than those formed by subtractive etching.

Consequently, the method disclosed in the document 2 is thought to achieve finer and denser wiring patterns.

The method disclosed in the document 2, however, could lower the reliability of via holes on connectability. This is because that the first and second wiring layers (corresponding to those discussed above) become thinner due to the fact that the surface portions of the wiring layer (the bottoms of via holes) are also removed when copper foil is etched away.

The method disclosed in the document 2 thus requires highly precise management to etching requirements. For example, the thickness of copper foil must be adjusted within a specific range in order that the first and second wiring layers do not give adverse effects to the reliability of via holes on connectability, after etching.

Moreover, as discussed, the method in the document 2 involves the process of removing copper foil to expose its under layer, or an insulating layer, and forming a plated layer on the exposed layer.

However, it is a well known fact that such a process cannot give sufficient adhesiveness to the interface of a plated layer and an insulating layer. "Sufficient" adhesiveness means, for example, 8 N/cm or higher in peel strength in compliance with JIS standards, JIS C 6481.

Measurements to a printed wiring board produced in the same as the one discussed above by the inventors of the present invention revealed 15 N/cm in peel strength for copper foil and an insulating layer whereas 6 N/cm in peel strength for a plated layer and the insulating layer.

Thus, it must be addressed that the method of producing a printed wiring board disclosed in the document 2 require improvements in adhesiveness between a plated layer (wiring layer) and an insulating layer.

SUMMARY OF THE INVENTION

A purpose of the present invention is to provide a printed wiring board, for example, a multilayer build-up printed wiring board, that exhibits higher stiffness and more sufficient adhesiveness between a wiring layer and an insulating layer, whereas having finer wiring patterns, and also a method producing such a printed wiring board, employing subtractive etching or semi-additive processing.

The present invention provides a printed wiring board comprising: an insulative substrate; a first wiring layer formed on at least one surface of the substrate; an insulating layer formed as covering the first wiring layer, the insulating layer being formed of a cured insulative sheet made of a high-stiff sheet-type reinforcing material containing resin; and a second wiring layer made of a conductive material and formed on the insulating layer, the first and second wiring layers being electrically connected to each other through at least one hole having a bottom, the second wiring layer being united with the insulating layer at an interface thereof with the conductive material injected into concave sections provided on the interface.

Moreover, the present invention provides a printed wiring board comprising: an insulative substrate having a first surface and a second surface; a first insulating layer and a second insulating layer formed on the first surface and the second surface, respectively; and a first wiring layer made of a conductive material and formed on the first insulating layer and a second wiring layer made of a conductive material and formed on the second insulating layer, the first and second wiring layers being electrically connected to each other via at least one through hole, the first wiring layer being united with the first insulating layer at an interface thereof with the conductive material injected into concave sections provided on the interface, and the second wiring layer being united with the second insulating layer at an interface thereof with the conductive material injected into concave sections provided on the interface.

Furthermore, the present invention provides a method of producing a printed wiring board comprising the steps of: forming a first wiring layer on at least one surface of an insulative substrate; forming a first insulating layer as covering the first wiring layer, with thermal press to cure an insulative sheet made of a high-stiff sheet-type reinforcing material containing resin on the first wiring layer; forming a second insulating layer on the first insulating layer, the second insulating layer being made of resin that contains a material that is etched by an agent at a first etching rate higher than a second etching rate at which the resin is etched; forming at least one hole with a bottom through the second insulating layer so that the first insulating layer is exposed through the hole; etching the second insulating layer with the agent so that remnants remaining in the bottom of the hole are removed, the remnants being a part of the second insulating layer removed when the hole is formed therethrough, and a part of the material located closer to an exposed surface of the second insulating layer and another part of the material exposed on the exposed surface are removed, thus the exposed surface becoming rough with concave sections that correspond to the removed parts of the second insulating layer; forming a conductive layer made of a conductive material on the exposed surface of the second insulating layer so that the hole and the concave sections are filled with the conductive material; and selectively etching the conductive layer to form a second wiring layer on the second insulating layer.

Furthermore, the present invention provides a method of producing a printed wiring board comprising the steps of: forming an insulating layer on each of both sides of an insulative substrate, the insulating layer being made of resin that contains a material that is etched by an agent at a first etching rate higher than a second etching rate at which the resin is etched; forming at least one through hole that penetrates the insulating layer and the substrate; etching the insulating layer with the agent so that a part of the material located closer to an exposed surface of the insulating layer and another part of the material exposed on the exposed surface are removed, thus the exposed surface becoming rough with concave sections that correspond to the removed parts of the insulating layer; forming a conductive layer made of a conductive material on the exposed surface of the insulating layer so that the through hole and the concave sections are filled with the conductive material; and selectively etching the conductive layer to form a wiring layer on the insulating layer.

DETAILED DESCRIPTION OF PREFERRED EMBODIMENTS

First Embodiment

Disclosed first with reference to FIGS. 1 to 10 is a first embodiment of a method of producing a printed wiring board, according to the present invention, employing subtractive etching. An exemplary printed wiring board to be produced in the first embodiment is a four-layer printed wiring board.

A feature of the first embodiment is to provide insulating layers with a dual-layer construction that consists of a first insulating layer formed by curing a B-staged insulative sheet made of a high-stiff sheet-type reinforcing material containing resin and a second insulating layer formed by curing resin ink containing particles or components soluble to an agent such as an oxidant or an acid, or a first insulating layer for higher stiffness and a second insulating layer for higher adhesiveness.

(Processing Step A1)

Figure 1:
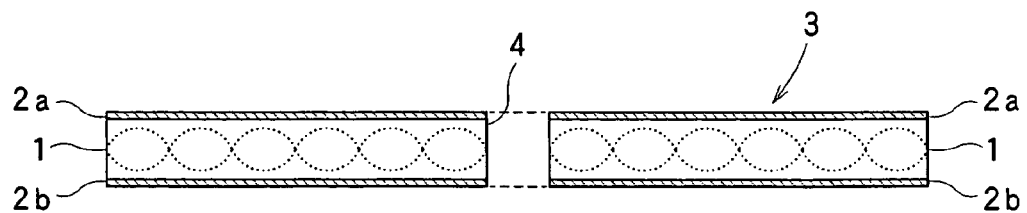
FIG. 1 is a schematic cross section illustrating a processing step A1 in a first embodiment of a method of producing a printed wiring board according to the present invention.

A processing step A1 is described with reference to FIG. 1.

Prepared first is a double-sided copper-coated board 3. The board 3 is made of a core substrate 1 containing a high-stiff sheet-type reinforcing material (illustrated with dot curves in FIG. 1) and coated with copper foil on both sides. The sheet-type reinforcing material may include glass cloth, glass nonwoven fabric, aramid cloth, or aramid nonwoven fabric, in this invention.

The double-sided copper-coated board 3 prepared in the first embodiment has a thickness of about 400 μm for the core substrate 1 and a thickness of 12 μm for each of copper foils 2a and 2b.

A through hole, or an interstitial via hole (IVH) 4 is formed on the double-sided copper-coated board 3 at a specific location. The IVH 4 is used in electrical connection of a first wiring layer 8 and a second wiring layer 9, which will be discussed later. Although just one IVH 4 is shown, a plurality of IVHs are provided depending on wiring in practical application. The IVH 4 can be formed with drilling or laser processing. It is formed by drilling as having about 300 μm in diameter in the first embodiment.

The thicknesses of the core substrate 1 and the copper foils 2a and 2b, and the diameter of the IVH 4 are not limited to those in the present invention.

(Processing Step A2)

Figure 2:
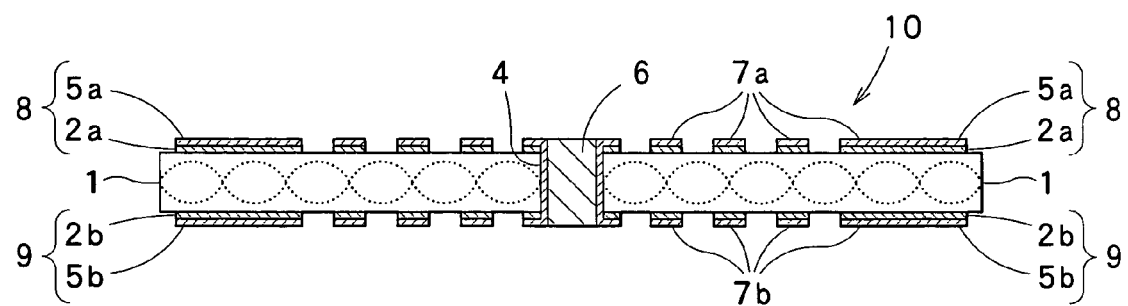
FIG. 2 is a schematic cross section illustrating a processing step A2 that follows the step A1 in the first embodiment of the method according to the present invention.

A processing step A2 is described with reference to FIG. 2.

First plated layers 5a and 5b are formed in the inner wall of the IVH 4 and also the surfaces of the copper foils 2a and 2b, respectively. The plated layers 5a and 5b are made of, for example, copper, and formed by electroless copper plating followed by electro copper plating. Specific plating requirements are set so that the plated layers 5a and 5b have about 20 μm in thickness in the first embodiment.

A filler 6 is then injected into the IVH 4. In detail, screen printing is employed in which a commercially-available hole-filling ink is injected, as the filler 6, into the IVH 4 and cured, followed by buff polishing excessive ink that flows over the first plated layers 5a and 5b and is cured, to have a flat surface. Roll coating is an alternative to screen printing.

The first plated layer 5a and the copper foil 2a, and also the first plated layer 5b and the copper foil 2b are then selectively etched away by photolithography to have wiring patterns 7a and 7b, respectively, thereon. Thus, the first plated layer 5a and the copper foil 2a, and the first plated layer 5b and the copper foil 2b are turned into a first wiring layer 8 and a second wiring layer 9, respectively.

The double-sided copper-coated board 3 that has been processed in the steps discussed above is referred to as a double-sided wiring board 10, hereinafter.

(Processing Step A3)

A processing step A3 is described with reference to FIGS. 3 and 4.

Figure 3:
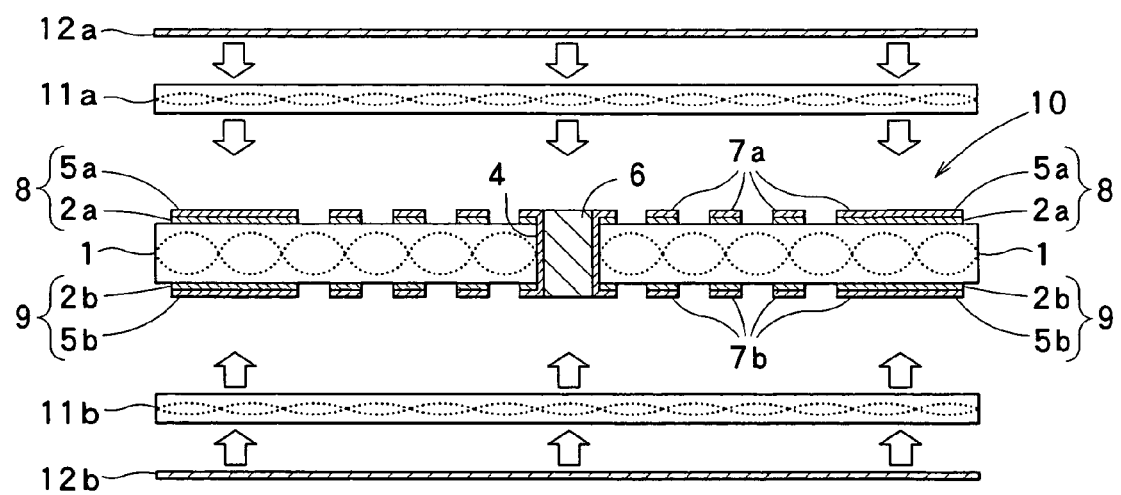
FIG. 3 is a schematic cross section illustrating a processing step A3 that follows the step A2 in the first embodiment of the method according to the present invention.

B-staged (half-cured) insulative sheets 11a and 11b each having about 60 μm in thickness are placed on the double-sided wiring board 10 on both sides, as shown in FIG. 3. Each B-staged insulative sheet is made of a high-stiff sheet-type reinforcing material containing epoxy resin (illustrated with dot curves in FIG. 3).

Copper foils 12a and 12b each having 12 μm in thickness are placed on the insulative sheets 11a and 11b, respectively.

The commercially-available copper foils 12a and 12b have two sides: one is a shiny side (S-side) with a flat shiny surface; and the other a mat side (M-side) with an irregular surface having convex and concave sections.

The sheet-type reinforcing material used in the step A3 may also include glass cloth, glass nonwoven fabric, aramid cloth, or aramid nonwoven fabric, in this invention.

Figure 4:
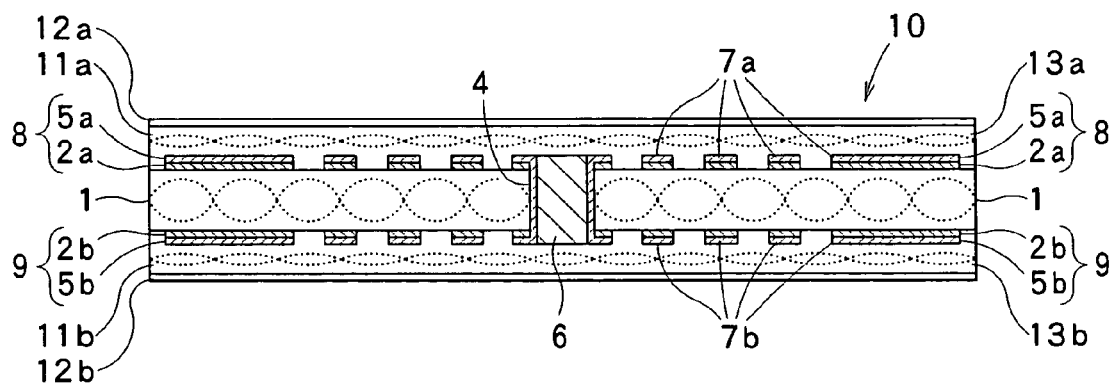
FIG. 4 is another schematic cross section illustrating the processing step A3 in the embodiment of the method according to the present invention.

Next, the double-sided wiring board 10 is thermally pressed in vacuum press equipment so that the B-staged (half-cured) insulative sheet 11a (11b) is cured and thus bonded to the board 10 and also to the copper foil 12a (12b) and united, as shown in FIG. 4. The cured insulative sheets 11a and 11b are turned into first insulating layers 13a and 13b, respectively.

In the thermal process, the copper foil 12a (12b) is placed on the insulative sheet 11a (11b) at the mat side, so that the first insulating layer 13a (13b) and the copper foil 12a (12b) are tightly attached to each other with substantially no gaps at their interface. When tightly attached, the mat side of each copper foil is transferred to the corresponding first insulating layer, so that the attached surface of the layer becomes rough having convex and concave sections which are inverse of those of the mat side.

The first insulating layers 13a and 13b contain the high-stiff sheet-type reinforcing material. Thus, the printed wiring board having the insulating layers containing the high-stiff sheet-type reinforcing material exhibits sufficiently high stiffness.

Discussed next is why the copper foils 12a and 12b are placed on the outermost sides of the double-sided wiring board 10.

The major purpose of the processing step A3 is to form the first insulating layers 13a and 13b (cured insulative sheets 11a and 11b) on the both sides of the double-sided wiring board 10.

In the thermal press process, if the insulative sheets 11a and 11b are pressed onto the double-sided wiring board 10 without the copper foils 12a and 12b, the cured sheets 11a and 11b could be attached to the heating plate of the thermal press machine.

Something is thus required to be placed between the heating plate and the insulative sheets 11a and 11b, which is not attached to the heating plate. It is, generally, copper foil for lower cost and higher thermal conductivity to effectively transfer heat from the heating plate to the insulative sheets.

Moreover, as already described, the surface of the first insulating layer 13a (13b), the upper surface of the layer 13a (13b) in a processing step A5 described later, which is the interface with the copper foil 12a (12b), becomes rough due to the existence of the copper foil. The rough surface gives higher adhesiveness to the first insulating layer 13a (13b) and a second insulating layer 17a (17b) which will be described later, than if it is a flat surface.

(Processing Step A4)

Figure 5:
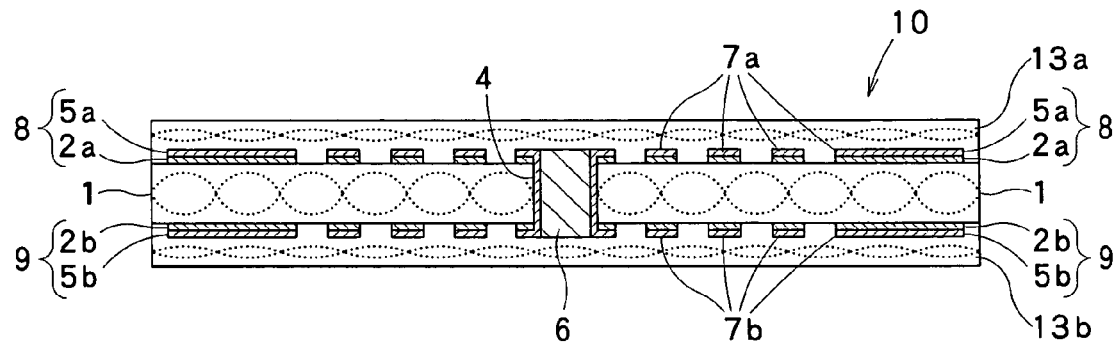
FIG. 5 is a schematic cross section illustrating a processing step A4 that follows the step A3 in the first embodiment of the method according to the present invention.

A processing step A4 is described with reference to FIG. 5. Unnecessary portions of the copper foils 12a and 12b remaining after the thermal press process are completely etched away, for example, with an aqueous solution of copper chloride.

(Processing Step A5)

Figure 6:
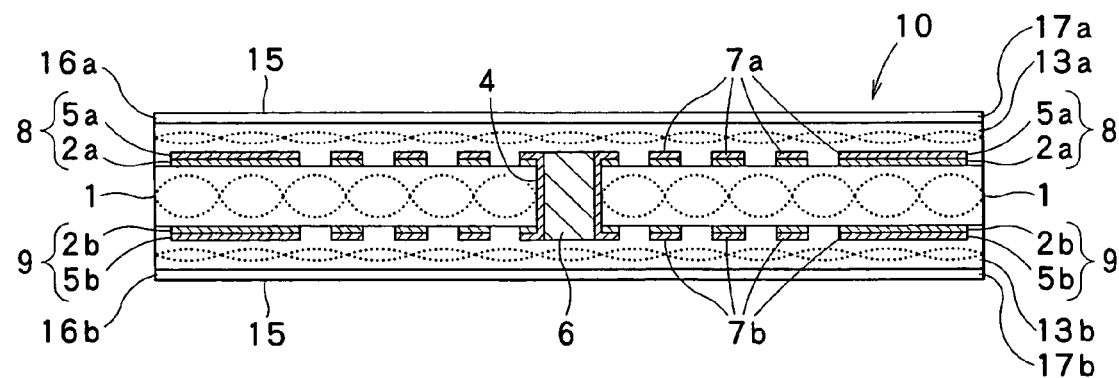
FIG. 6 is a schematic cross section illustrating a processing step A5 that follows the step A4 in the first embodiment of the method according to the present invention.

A processing step A5 is described with reference to FIG. 6.

An insulative resin ink 15 is applied onto the surfaces of the first insulating layers 13a and 13b exposed in the processing step A4, for example, by roll coating. The ink 15 is mainly composed of epoxy resin containing about 10% by weight of particles 18 (FIG. 7) made of calcium carbonate ($CaCO_3$) and having a diameter in the range from 1 μm to 10 μm and a solvent to turn the epoxy resin into ink.

The layers of the insulative resin ink 15 applied onto the both sides of the first insulating layers 13a and 13b are referred to as resin ink layers 16a and 16b, respectively. Specific application requirements of the ink 15 are set so that the ink layers 16a and 16b have a thickness of about 20 μm, in the first embodiment.

The double-sided wiring board 10 having the resin ink layers 16a and 16b formed thereon is heated, for example, for 1 hour at 150° C. The heating process evaporates the solvent in the ink layers 16a and 16b and cures these layers. The cured layers turn into the second insulating layers 17a and 17b having a thickness of about 15 μm. The layers 17a and 17b are formed for higher adhesiveness with second plated layers 21a and 21b, respectively, which will be described later.

(Processing Step A6)

A processing step A6 is described with reference to FIGS. 7 and 8.

Figure 7:
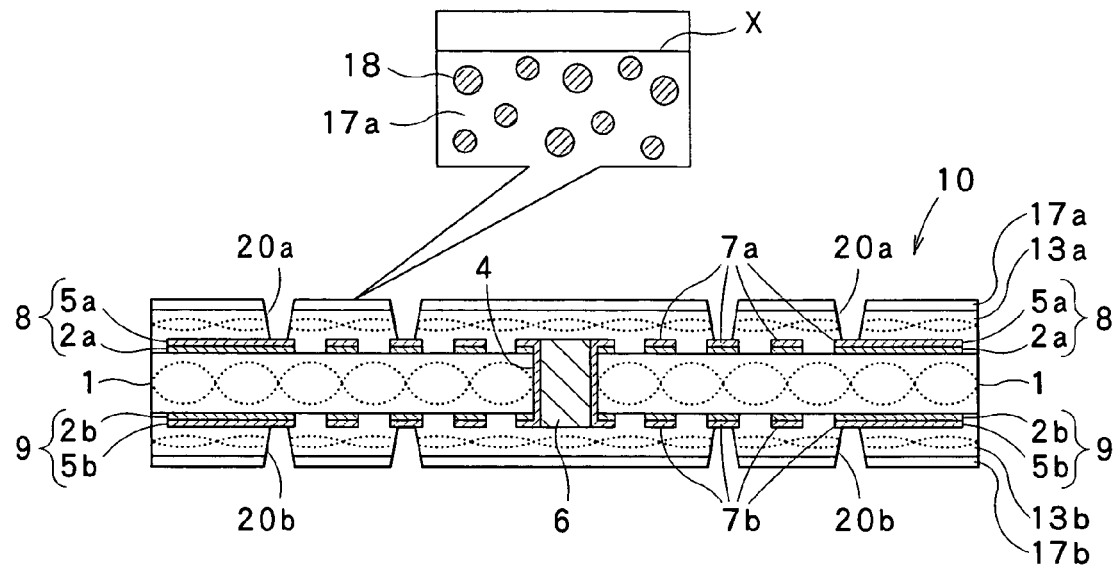
FIG. 7 is a schematic cross section illustrating a processing step A6 that follows the step A5 in the first embodiment of the method according to the present invention.

First and second blind via holes (BVH) 20a and 20b are formed in specific locations, as shown in FIG. 7. Each BVH is a hole with a bottom. The first BVH 20a are used for electrical connection between the first wiring layer 8 and a third wiring layer 23 which will be described later. The second BVH 20b are used for electrical connection between the second wiring layer 9 and a fourth wiring layer 24 which will be described later.

In detail, a laser beam is emitted to the first insulating layer 13a (13b) and the second insulating layer 17a (17b) at specific locations to remove a layer portion at each location to expose the first wiring layer 8 (the second wiring layer 9), thus having the BVHs 20a (20b) with a diameter of about 100 μm. The laser may be carbon dioxide laser or YAG laser.

Figure 8:
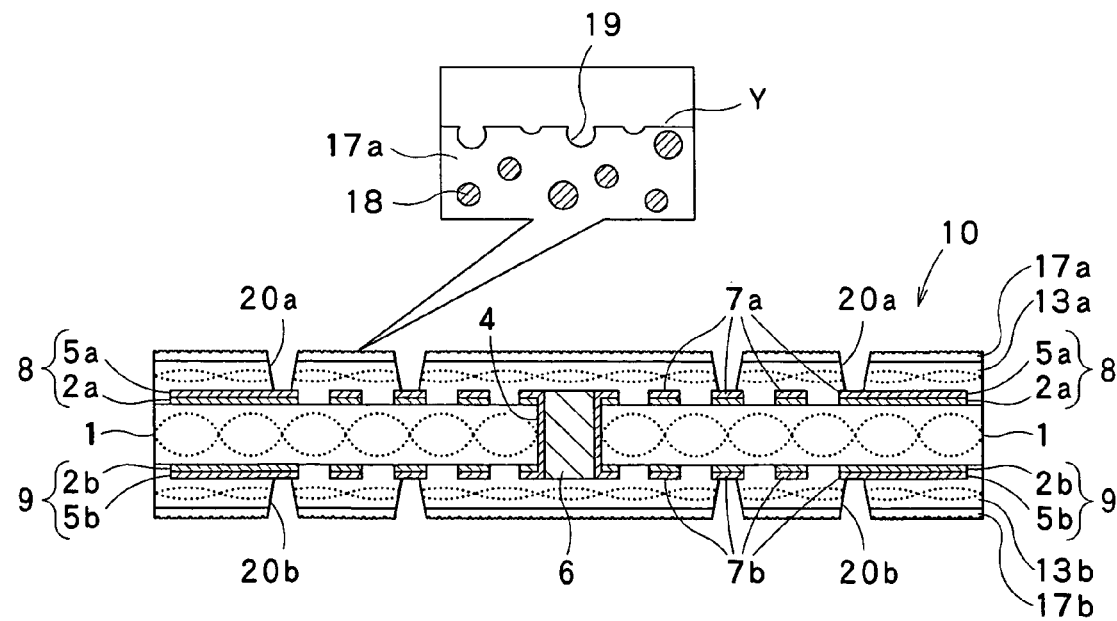
FIG. 8 is another schematic cross section illustrating the processing step A6 in the embodiment of the method according to the present invention.

Next, as shown in FIG. 8, remnants in the bottom of each BVH 20a (20b) remaining after the laser processing are removed and the inner wall of the BVH and the surface of the second insulating layer 17a (17b) are made rough by oxidant treatment (chemical roughening treatment). Specific oxidant treatment requirements are set so that the roughened second insulating layers 17a and 17b have about 10 μm in thickness in the first embodiment.

The oxidant treatment in the first embodiment includes a swelling process with an aqueous solution containing mainly sodium hydroxide or a solvent, a roughening treatment with an oxidant, such as, permanganate (potassium permanganate, etc.) or sodium hydroxide, and a neutralization process (acid treatment) with an aqueous solution containing, for example, sulfuric acid.

Discussed next is why the surfaces of the second insulating layers 17a and 17b are made rough in the oxidant treatment.

The second insulating layers 17a and 17b contain epoxy resin and the particles 18 made of calcium carbonate ($CaCO_3$), as described above.

The epoxy resin contained in the vicinity of the surface of each of the second insulating layers 17a and 17b is removed in the oxidant treatment, thus the particles 18 being exposed to the surface. It is well known that epoxy resin is soluble to an oxidant.

The exposed particles 18 are then removed in the neutralization process. It is also well known that calcium carbonate is soluble to acid.

As shown in a partially enlarged view in FIG. 7, a surface X of the second insulating layer 17a is flat before the oxidant treatment. In contrast, as shown in a partially enlarged view in FIG. 8, a surface Y of the layer 17a becomes rough with concave sections 19 (where the particles 18 were removed) after the oxidant treatment. Although not shown, the same is true for the second insulating layer 17b.

(Processing Step A7)

A processing step A7 is described with reference to FIG. 9.

A second plated layer 21a (21b) made of, for example, copper is formed on the second insulating layer 17a (17b), so that the inner wall of each BVH 20a (20b) is covered with this plated layer. The plated layers 21a and 21b are formed, for example, by electroless copper plating followed by electro copper plating. Specific plating requirements are set so that the plated layers 21a and 21b have about 20 μm in thickness in the first embodiment.

Figure 9:
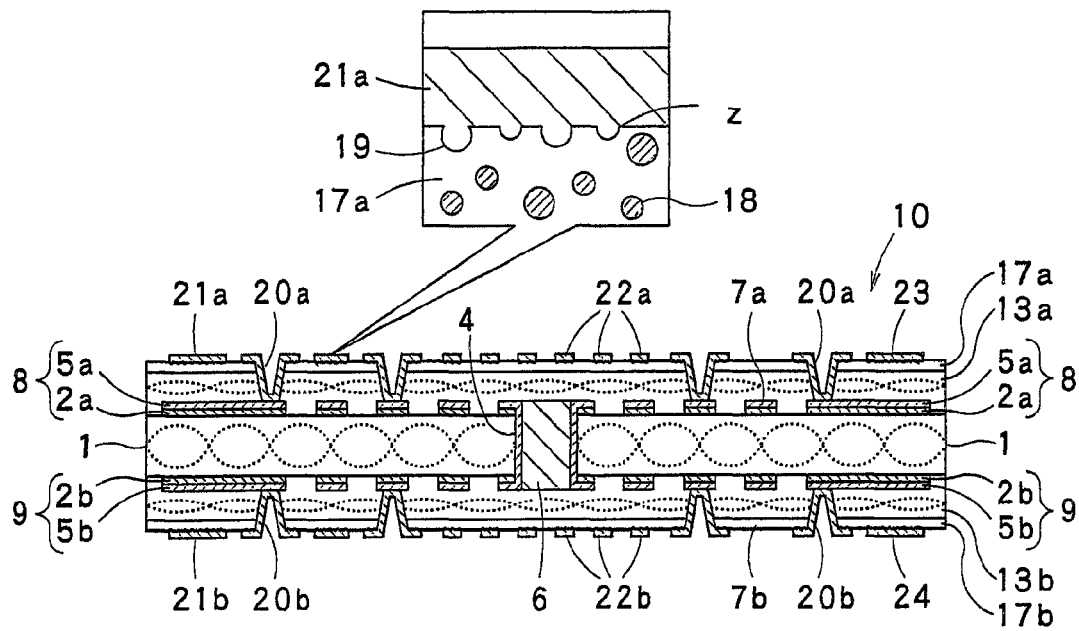
FIG. 9 is a schematic cross section illustrating a processing step A7 that follows the step A6 in the first embodiment of the method according to the present invention.

As shown in a partially enlarged view in FIG. 9, the concave sections 19 formed on the second insulating layer 17a are filled with the second plated layer 21a. Although not shown, the concave sections 19 formed on the second insulating layer 17b are also filled with the second plated layer 21b. The anchor effect gives sufficient adhesiveness to the layers 21a and 21b and the layers 17a and 17b, respectively, at their interface Z.

The second plated layers 21a and 21b are then selectively etched away by photolithography to form a third wiring layer 23 and a fourth wiring layer 24, respectively, with wiring patterns 22a and 22b, respectively, thereon.

(Processing Step A8)

Figure 10:
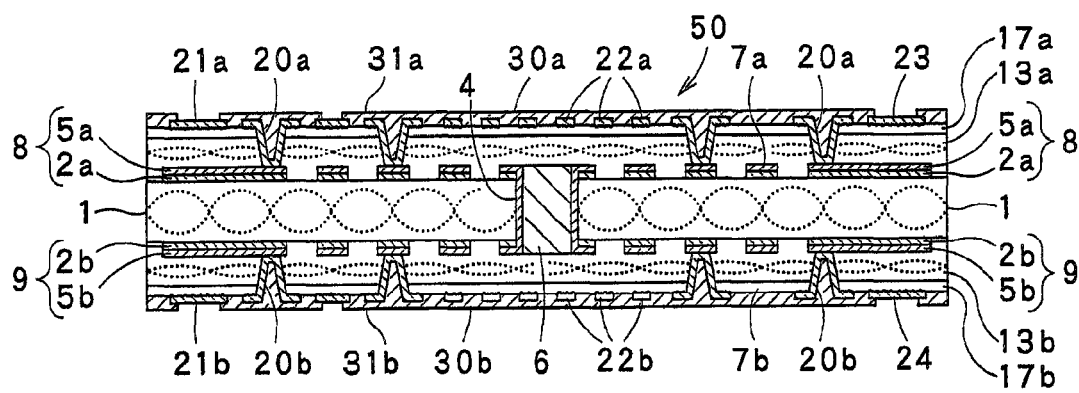
FIG. 10 is a schematic cross section illustrating a processing step A8 that follows the step A7 in the first embodiment of the method according to the present invention.

A processing step A8 is described with reference to FIG. 10.

A solder resist ink 30a (30b) is applied on the second insulating layer 17a (17b) and the third wiring layer 23 (the fourth wiring layer 24) by screen printing. The inks 30a and 30b are then heated, for example, for 20 minutes at 80° C., so that these inks are turned into half-cured solder resist layers 31a and 31b, respectively.

The half-cured solder resist layers 31a and 31b are then selectively etched away by photolithography to have desired patterns. The selectively-etched layers 31a and 31b are heated, for example, for 1 hour at 120° C., thus turned into sufficiently cured solder resist layers 31a and 31b, respectively, with the desired patterns.

Produced through these processing steps, in the first embodiment, is a four-layer printed wiring board 50.

The third and fourth wiring layers 23 and 24 have a single-layer structure of the second plated layers 21a and 21b, respectively, in the four-layer printed wiring board 50. Thus, the thinner the plated layers 21a and 21b, the thinner the wiring layers 23 and 24. This single-layer structure allows finer and denser wiring patterns on the third and fourth wiring layers 23 and 24, in the first embodiment even though employing subtractive etching.

Moreover, the first embodiment achieves higher adhesiveness between the second insulating layers 17a and 17b and the second plated layers 21a and 21b, respectively, with the concave sections 19 formed on the layers 17a and 17b in the oxidant treatment. This is different from the known technique in which a plated layer is directly formed on a copper-foil-removed insulating layer.

The second insulating layers 17a and 17b and the second plated layers 21a and 21b, respectively, exhibit about 12 N/cm in peel strength (in compliance with JIS standards, JIS C 6481).

Second Embodiment

Disclosed next with reference to FIGS. 8 and 11 to 16 is a second embodiment of a method of producing a printed wiring board, according to the present invention, employing semi-additive processing. An exemplary printed wiring board to be produced in the second embodiment is also a four-layer printed wiring board.

Different from the first embodiment employing subtractive etching, the second embodiment employs semi-additive processing. In general, semi-additive processing requires a higher number of processing steps than subtractive etching, however, more advantageous on achieving finer and denser wiring patterns.

The second embodiment is identical to the first embodiment, except for a wiring pattern forming process. The elements in the second embodiment that are the same as or analogous to those in the first embodiment are given the same reference numerals as those in the first embodiment, and not described in detail or the description thereof is omitted.

(Processing Step B1)

A processing step B1 is described with reference to FIGS. 8 and 11.

Processing steps corresponding to the steps A1 to A6 (the first embodiment) are performed to produce a double-sided wiring board 10, identical to the one shown in FIG. 8.

Figure 11:
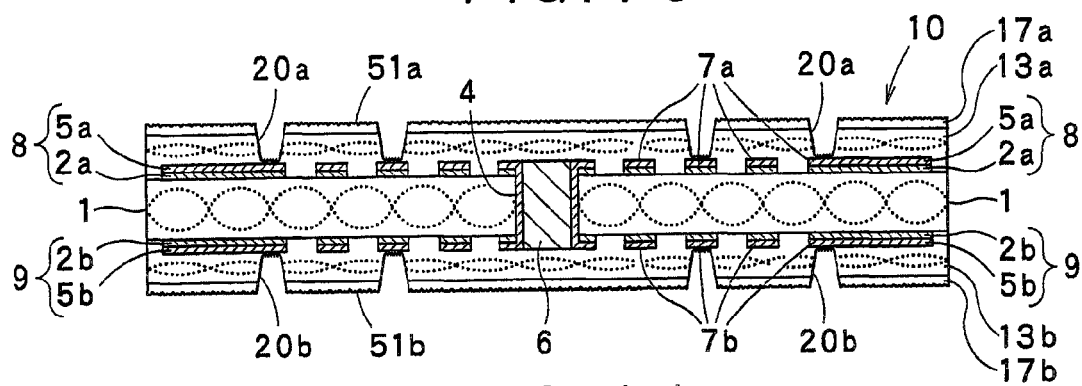
FIG. 11 is a schematic cross section illustrating a processing step B1 in a second embodiment of a method of producing a printed wiring board according to the present invention.

Next, as shown in FIG. 11, first conductive layers 51a and 51b are formed on both sides of the double-sided wiring board 10 produced through the above steps, for example, by electroless copper plating. Specific requirements of the electroless copper plating are set so that the conductive layers 51a and 51b have about 1 µm in thickness in the second embodiment. An alternative to the electroless copper plating is a dry process, such as, sputtering and deposition, in forming the conductive layers.

(Processing Step B2)

A processing step B2 is described with reference to FIGS. 12 and 13.

Figure 12:
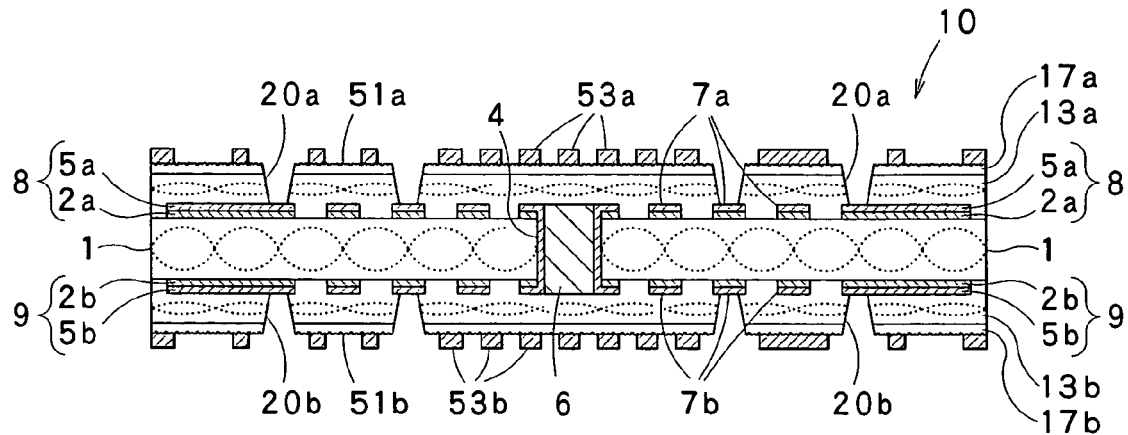
FIG. 12 is a schematic cross section illustrating a processing step B2 that follows the step B1 in the second embodiment of the method according to the present invention.

As shown in FIG. 12, sheets of plated resists 53a and 53b having a thickness of, for example, 40 µm are laminated on the first conductive layers 51a and 51b, respectively. The plated resists 53a and 53b are then selectively etched by photolithography to have specific patterns thereon.

Figure 13:
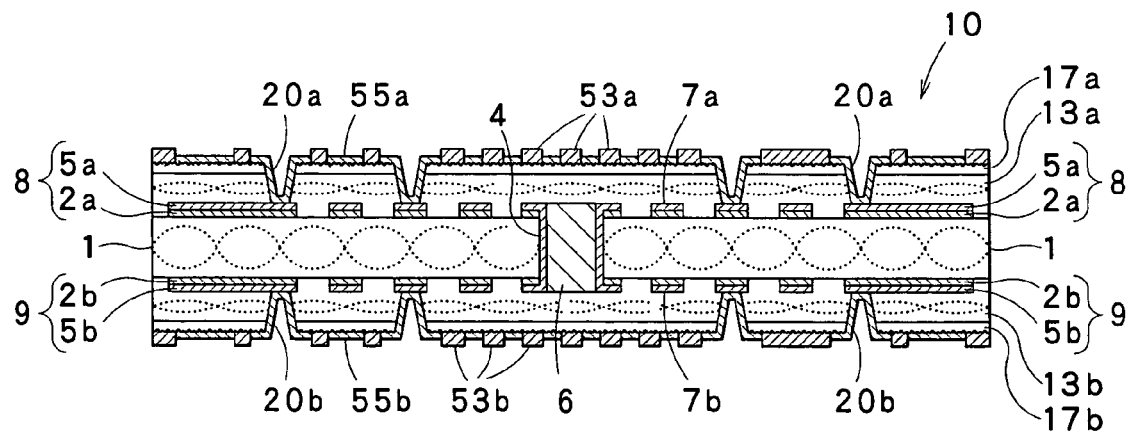
FIG. 13 is another schematic cross section illustrating the processing step B2 in the embodiment of the method according to the present invention.

Next, as shown in FIG. 13, electro copper plating is performed to the double-sided wiring board 10 having the plated resists 53a and 53b with the specific patterns thereon to selectively form field-plated layers 55a and 55b on the exposed first conductive layers 51a and 51b, respectively, so that the inner walls of the BVHs 20a and 20b are covered with the layers 55a and 55b, respectively. Specific electro copper plating requirements are set so that the plated layers 55a and 55b have about 20 µm in thickness in the second embodiment.

(Processing Step B3)

A processing step B3 is described with reference to FIGS. 14 and 15.

Figure 14:
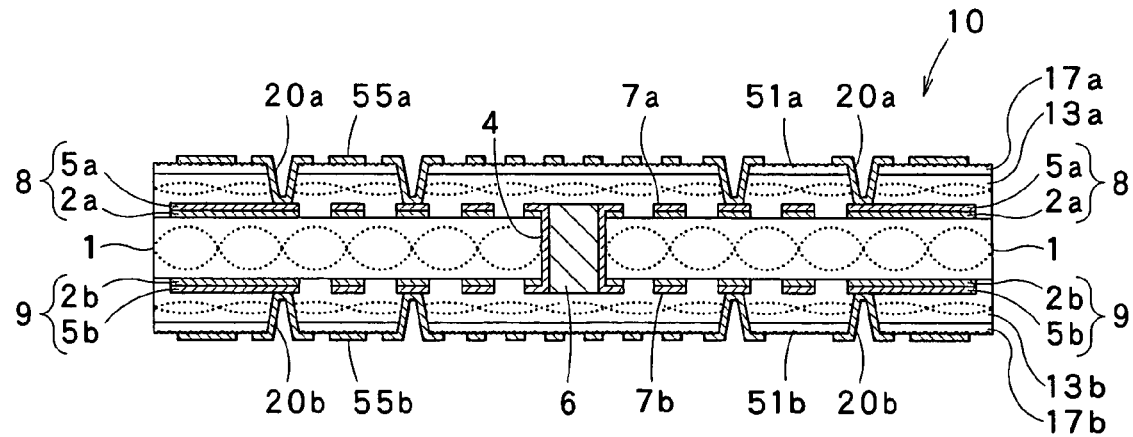
FIG. 14 is a schematic cross section illustrating a processing step B3 that follows the step B2 in the second embodiment of the method according to the present invention.
Figure 15:
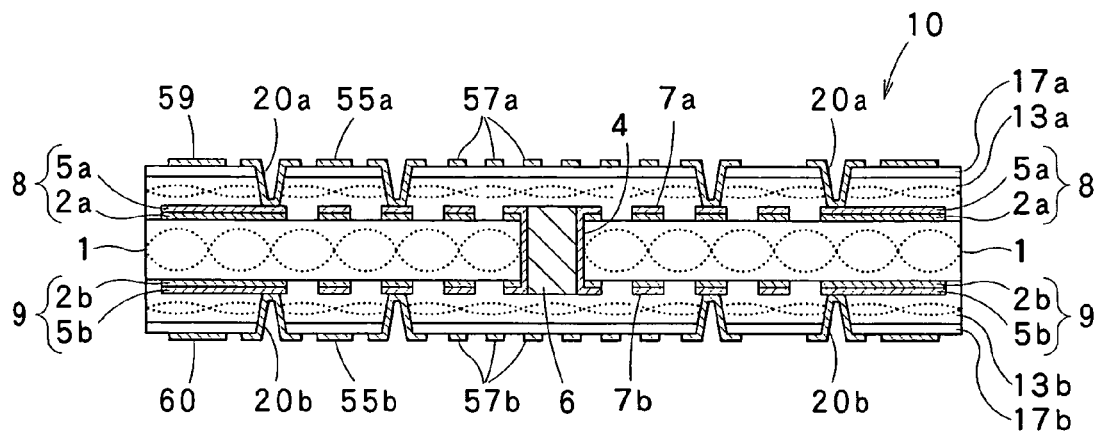
FIG. 15 is another schematic cross section illustrating the processing step B3 in the second embodiment of the method according to the present invention.

The plated resists 53a and 53b are removed, as shown in FIG. 14. Next, as shown in FIG. 15, the exposed first conductive layers 51a and 51b are etched away.

Produced through these processes are third and fourth wiring layers 59 and 60 having wiring patterns 57a and 57b, respectively, formed thereon.

Although not shown in FIGS. 14 and 15, like the first embodiment discussed with reference to the partially enlarged view in FIG. 8 (step A6), the second insulating layers 17a and 17b in the second embodiment have a rough surface with the concave sections 19, thus the anchor effect giving sufficient adhesiveness to the third and fourth wiring layers 59 and 60 and the layers 17a and 17b, respectively, at their interface.

Moreover, like the first embodiment, the third and fourth wiring layers 59 and 60 are electrically connected to the first and second wiring layers 8 and 9, respectively, through the BVHs 20a and 20b having a bottom, respectively.

In the processing step B3, the field-plated layers 55a and 55b are also etched when the exposed first conductive layers 51a and 51b are etched away. However, since the layers 55a and 55b have a thickness of about 20 µm compared to about 1 µm for the layers 51a and 51b, the former layers are not be completely etched away but partially etched at their surface sections.

(Processing Step B4)

Figure 16:
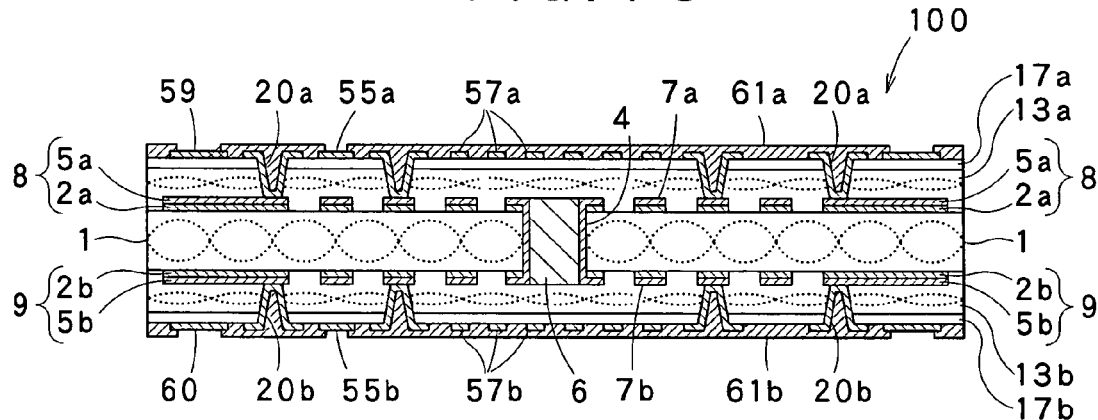
FIG. 16 is a schematic cross section illustrating a processing step B4 that follows the step B3 in the second embodiment of the method according to the present invention.

A processing step B4 is described with reference to FIG. 16.

In the same way as the processing step A8 in the first embodiment, solder resists 61a and 61b having specific patterns are formed on both sides of the double-sided wiring board 10, after the processing step B3.

Produced through these processing steps, in the second embodiment, is a four-layer printed wiring board 100.

The second embodiment employs semi-additive processing in forming of the third and fourth wiring layers 59 and 60, thus allowing finer and denser wiring patterns on these wiring layers.

Moreover, the second embodiment achieves higher adhesiveness between the second insulating layers 17a and 17b and the third and fourth wiring layers 59 and 60, respectively, with the concave sections 19 formed on the layers 17a and 17b in the oxidant treatment. This is different from the known technique in which a plated layer is directly formed on a copper-foil-removed insulating layer.

The second insulating layers 17a and 17b and the third and fourth wiring layers 59 and 60, respectively, exhibit about 12 N/cm in peel strength (in compliance with JIS standards, JIS C 6481).

Third Embodiment

Disclosed next with reference to FIGS. 17 to 23 is a third embodiment of a method of producing a printed wiring board, according to the present invention, employing subtractive etching, that gives further advantages to the first and second embodiments.

In detail, the third embodiment achieves finer and denser wiring patterns not only on the third and fourth wiring layers 23 and 24 (the first embodiment) or the third and fourth wiring layers 59 and 60 (the second embodiment), but also the first and second wiring layers 8 and 9, in a four-layer printed wiring board.

The elements in third embodiment that are the same as or analogous to those in the first embodiment are given the same reference numerals as those in the first embodiment, and not described in detail or the description thereof is omitted.

(Processing Step C1)

Figure 17:
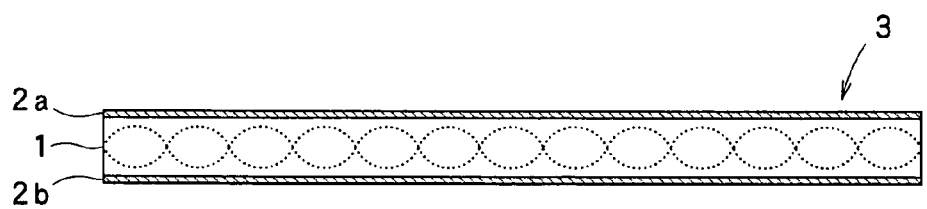
FIG. 17 is a schematic cross section illustrating a processing step C1 in a third embodiment of a method of producing a printed wiring board according to the present invention.

A processing step C1 is described with reference to FIGS. 17 and 18.

Prepared first is a double-sided copper-coated board 3 identical to the one used in the processing step A1 in the first embodiment. The board 3 is made of a core substrate 1 containing a high-stiff sheet-type reinforcing material (illustrated with dot curves in FIG. 17) and coated with copper foils 2a and 2b on both sides. The interface between the copper foil and the core substrate 1 is made rough for higher adhesiveness.

Figure 18:
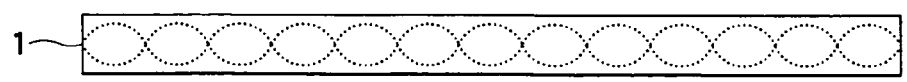
FIG. 18 is another schematic cross section illustrating the processing step C1 in the third embodiment of the method according to the present invention.

As shown in FIG. 18, the copper foils 2a and 2b are completely etched away to have the core substrate 1 with a rough surface on both sides. A core substrate with no copper foils may be prepared, if available from manufacturers, to omit such an etching process. In any case, it is preferable that the core substrate has a rough surface on both sides for higher adhesiveness with first and second insulating layers 105a and 105b, which will be disclosed later.

(Processing Step C2)

A processing step C2 is described with reference to FIGS. 19 to 21.

Figure 19:
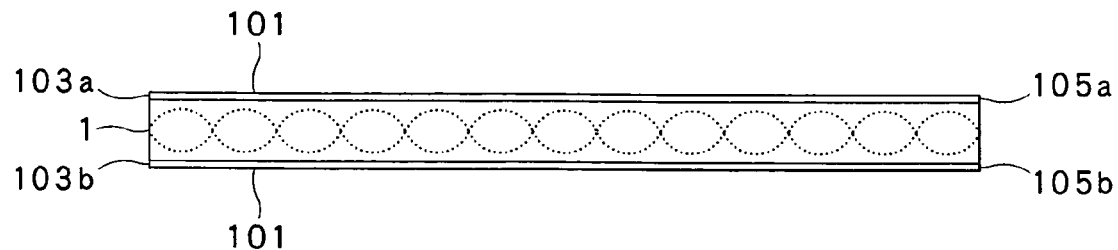
FIG. 19 is a schematic cross section illustrating a processing step C2 that follows the step C1 in the third embodiment of the method according to the present invention.

As shown in FIG. 19, an insulative resin ink 101 is applied onto the both sides of the core substrate 1, for example, by roll coating, like the processing step A5 in the first embodiment. The ink 101 is mainly composed of epoxy resin containing about 10% by weight of particles 109 (FIG. 20) made of calcium carbonate ($CaCO_3$) and having a diameter in the range from 1 μm to 10 μm and a solvent to turn the epoxy resin into ink.

The layers of the insulative resin ink 101 applied onto the both sides of the core substrate 1 are referred to as resin ink layers 103a and 103b. Specific application requirements of the ink 101 are set so that the ink layers 103a and 103b have a thickness of about 20 μm, in the third embodiment.

The core substrate 1 having the resin ink layers 103a and 103b formed thereon is heated, for example, for 1 hour at 150° C. The heating process evaporates the solvent in the ink layers 103a and 103b and cures these layers. The cured layers turn into the first insulating layers 105a and 105b having a thickness of about 15 μm. The layers 105a and 105b are formed for higher adhesiveness with first plated layers 115a and 115b, respectively, which will be described later.

Figure 20:
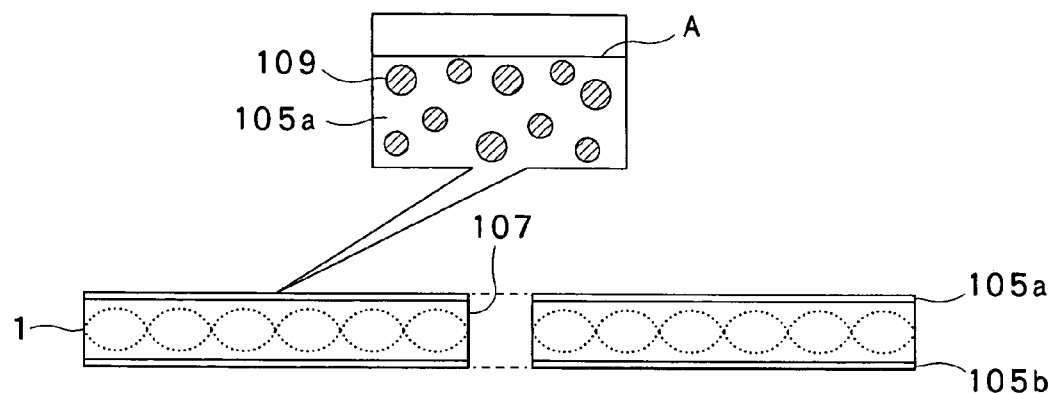
FIG. 20 is another schematic cross section illustrating the processing step C2 in the third embodiment of the method according to the present invention.

A through hole, or an IVH 107 is formed on the core substrate 1 having the first insulating layers 105a and 105b formed thereon at a specific location, as shown in FIG. 20. The IVH 107 can be formed with drilling or laser processing. It is formed by drilling as having about 300 μm in diameter in the third embodiment. Although just one IVH 107 is shown, a plurality of IVHs are provided depending on wiring in practical application.

Figure 21:
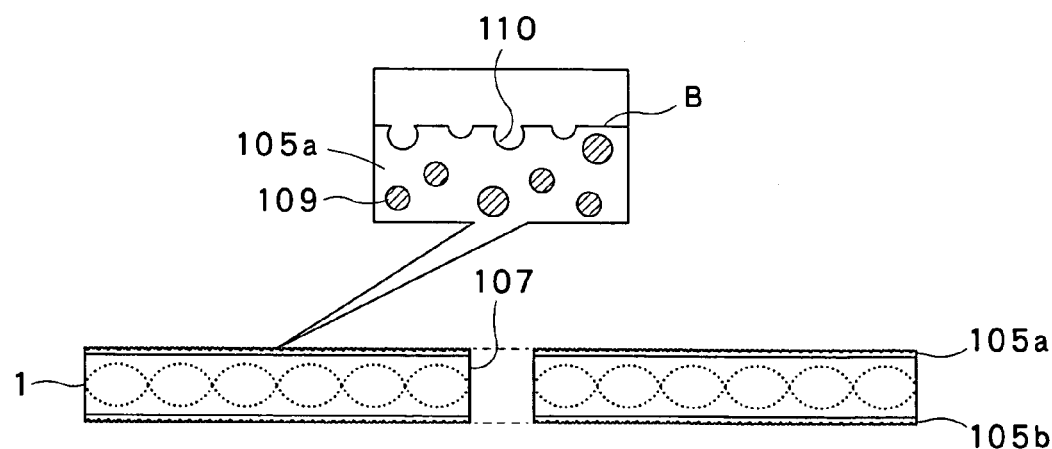
FIG. 21 is still another schematic cross section illustrating the processing step C2 in the third embodiment of the method according to the present invention.

Next, as shown in FIG. 21, oxidant treatment is applied to the core substrate 1 so that the first insulating layers 105a and 105b have a rough surface, like the processing step A6 in the first embodiment.

As shown in a partially enlarged view in FIG. 20, a surface A of the first insulating layer 105a is flat before the oxidant treatment. In contrast, as shown in a partially enlarged view in FIG. 21, a surface B of the layer 105a becomes rough with concave sections 110 after the oxidant treatment. Although not shown, the same is true for the first insulating layer 105b.

Specific oxidant treatment requirements are made so that the roughened first insulating layers 105a and 105b have about 10 μm in thickness in the third embodiment.

The reason why the surfaces of the first insulating layers 105a and 105b are made rough in the oxidant treatment is the same as discussed in the first embodiment.

(Processing Step C3)

A processing step C3 is described with reference to FIG. 22.

Figure 22:
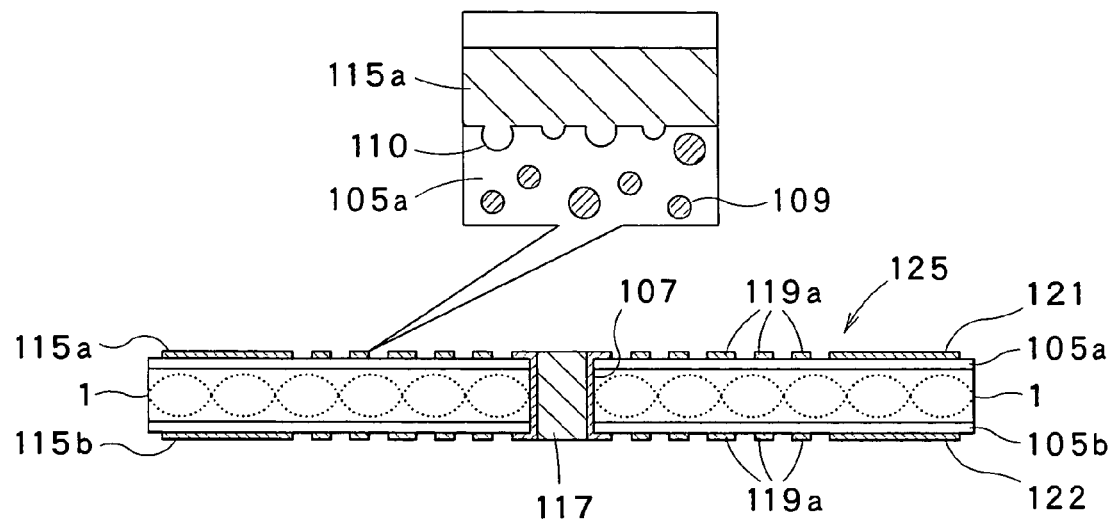
FIG. 22 is a schematic cross section illustrating a processing step C3 that follows the step C2 in the third embodiment of the method according to the present invention.

First plated layers 115a and 115b made of, for example, copper are formed on the first insulating layers 105a and 105b, respectively, so that the inner wall of the IVH 107 and the concave sections 110 are covered with these plated layers, as shown in a partially enlarged view in FIG. 22. The plated layers 115a and 115b are formed, for example, by electroless copper plating followed by electro copper plating. Specific plating requirements are set so that the plated layers 115a and 115b have about 20 μm in thickness in the third embodiment.

A filler 117 is then injected into the IVH 107. In detail, screen printing is employed in which a commercially-available hole-filling ink is injected, as the filler 117, into the IVH 107 and cured, followed by buff polishing excessive ink that flows over the first plated layers 115a and 115b and is cured, to have a flat surface. Roll coating is an alternative to screen printing.

The first plated layers 115a and 115b are then selectively etched away by photolithography to have wiring patterns 119a and 119b, respectively, thereon. Thus, the first plated layers 115a and 115b are turned into a first wiring layer 121 and a second wiring layer 122, respectively.

The core substrate 1 having the first and second wiring layer 121 and 122 is referred to as a double-sided wiring board 125, hereinafter.

(Processing Step C4)

Figure 23:
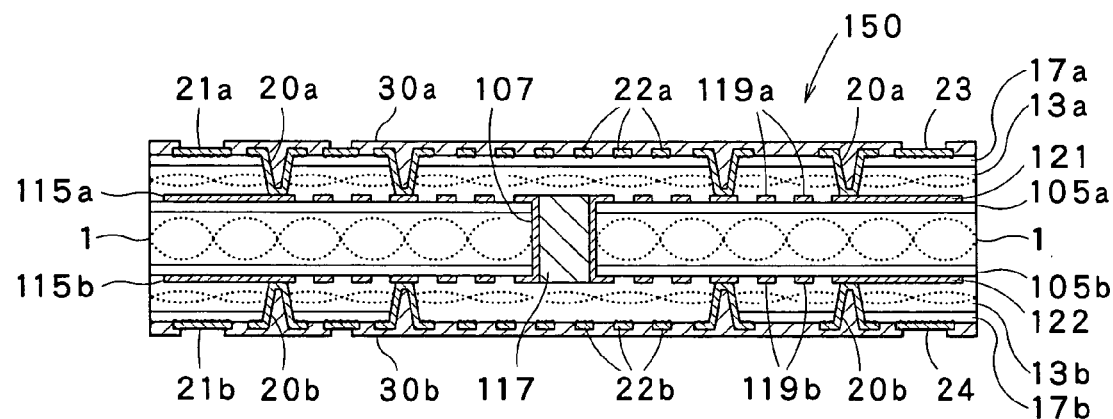
FIG. 23 is a schematic cross section illustrating a processing step C4 that follows the step C3 in the third embodiment of the method according to the present invention.

A processing step C4 is described with reference to FIG. 23.

Steps the same as the processing steps A3 to A8 in the first embodiment are performed to the double-sided wiring board 125 to obtain a four-layer printed wiring board 150.

Compared to the four-layer printed wiring board 50 in the first embodiment, the four-layer printed wiring board 150 in the third embodiment has a single-layer structure of the first plated layers 115a and 115b for the first and second wiring layer 121 and 122, respectively, in addition to the third and fourth wiring layers 23 and 24. Thus, the thinner the plated layers 115a and 115b, the thinner the wiring layer 121 and 122. This single-layer structure allows finer and denser wiring patterns on the first to fourth wiring layers 121, 122, 23 and 24, in the third embodiment even though employing subtractive etching.

In the third embodiment, the concave sections 110 formed on the first insulating layers 105a and 105b give the anchor effect that offers sufficient adhesiveness to these layers 105a and 105b and the first and second wiring layers 121 and 122, respectively.

Moreover, in the third embodiment, the first insulating layers 105a and 105b and the first and second wiring layers 121 and 122, respectively, exhibit about 12 N/cm in peel strength (in compliance with JIS standards, JIS C 6481).

[Modification]

Figure 24:
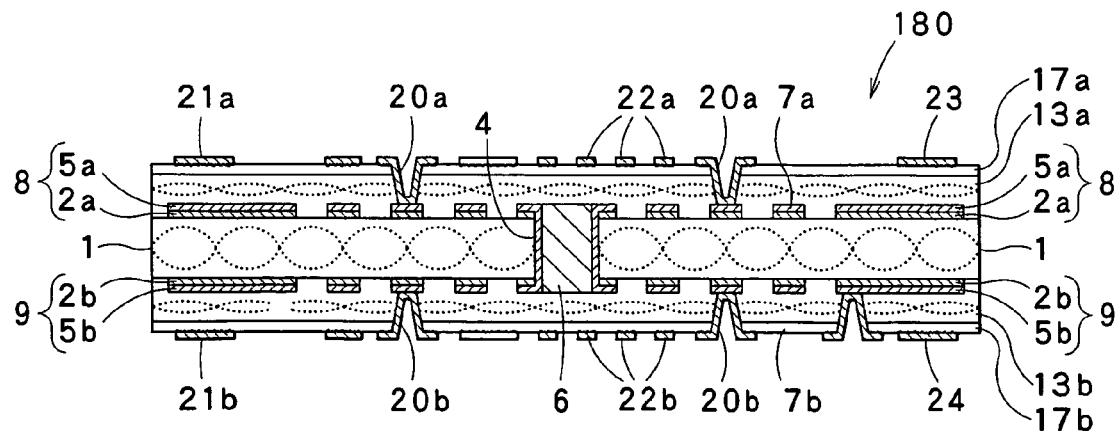
FIG. 24 is a schematic cross section illustrating a processing step D1 in a modification to the first embodiment of a method of producing a printed wiring board according to the present invention.
Figure 25:
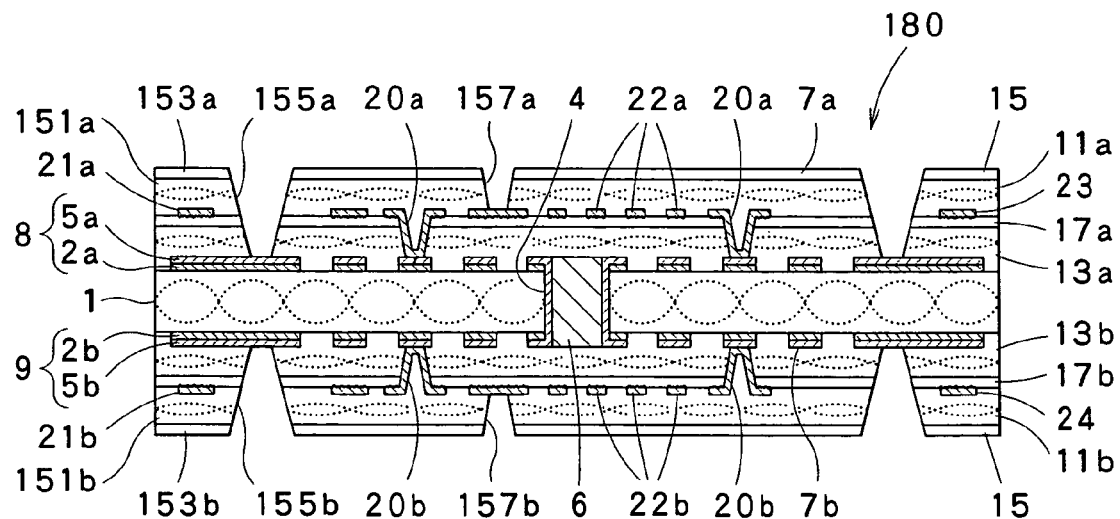
FIG. 25 is another schematic cross section illustrating the processing step D1 in the modification of the method according to the present invention.
Figure 26:
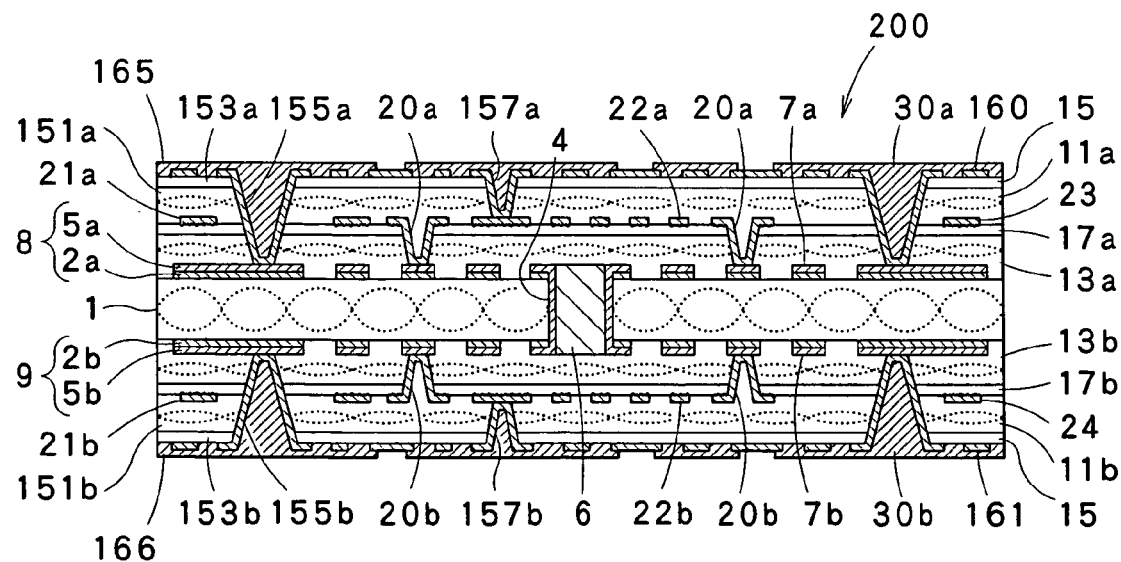
FIG. 26 is a schematic cross section illustrating a processing step D2 that follows the step D1 in the modification of the method according to the present invention.

Disclosed next with reference to FIGS. 24 to 26 is a modification to the first embodiment of a method of producing a printed wiring board, according to the present invention, employing semi-additive processing. An exemplary printed wiring board to be produced in this modification is a six-layer printed wiring board having a further multilayered structure than the four-layer printed wiring board in the first embodiment.

The elements in this modification that are the same as or analogous to those in the first embodiment are given the same reference numerals as those in the first embodiment, and not described in detail or the description thereof is omitted.

(Processing Step D1)

The processing step D1 is described with reference to FIGS. 24 and 25.

Processing steps corresponding to the steps A1 to A7 (the first embodiment) are performed to produce a double-sided wiring board 180, as shown in FIG. 24.

Next, as shown in FIG. 25, processing steps corresponding to the steps A3 to A5 (the first embodiment) are carried out to form third insulating layers 13a and 13b and then fourth insulating layers 153a and 153b on both sides of the double-sided wiring board 180. In detail, B-staged (half-cured) insulative sheets 11a and 11b are cured to be turned into the third insulating layers 151a and 151b, respectively, and insulative resin inks 15 are cured to be turned into the fourth insulating layers 153a and 153b, respectively.

Next, a processing step corresponding to the step A6 (the first embodiment) is carried out to form LVHs 155a, 157a, 155b, and 157b. The LVH 155a is used for connecting a fifth wiring layer 160 to a first wiring layer 8, the LVH 157a for the layer 160 to a third wiring layer 23, the LVH 155b for a sixth wiring layer 161 to a second wiring layer 9, and the LVH 157b for the layer 161 to a fourth wiring layer 24, which will be described later.

(Processing Step D2)

A processing step D2 is described with reference to FIG. 26.

After the processing step D1, oxidant treatment is applied to the double-sided wiring board 180, in the same way as the step A6 (the first embodiment).

In the same way as the processing step A7 (the first embodiment), the fifth wiring layer 160 is formed on the fourth insulating layer 153a so that the inner walls of the LVHs 155a and 157a are covered with the layer 160, and the sixth wiring layer 161 is formed on the fourth insulating layer 153b so that the inner walls of the LVHs 155b and 157b are covered with the layer 161

Also, in the same way as the processing step A7 (the first embodiment), solder resist layers 165 and 166 are formed on the fourth insulating layers 153a and 153b, respectively.

Produced through these processing steps, in this modification, is a six-layer printed wiring board 200.

Although disclosed above in detail, the present invention is not limited to the first to third embodiments and the modification on the structure and processing steps.

In the first to third embodiments, the double-sided copper-coated board is prepared as a starting material for the processing steps. Not only the double-sided copper-coated board, but also, for example, a multilayered board (shield board) having wiring layers therein can be used as a starting material in the present invention.

In general, such commercially-available double-sided copper-coated board and multilayered board have copper foils on both sides. However, such boards but with no copper foils on both sides may also be used, if available from manufacturers.

Moreover, in the first to third embodiments, B-staged (half-cured) insulative sheets containing a sheet-type reinforcing material and also copper foils are used for forming the first insulating layers 13a and 13b, and the third insulating layers 151a and 151b. The present invention may, however, employ a B-staged (half-cured) insulative sheet containing a sheet-type reinforcing material, coated with copper foil.

The insulative resin inks 15 and/or 101 may be added with butadiene components instead of particles 18 and/or 109 made of calcium carbonate ($CaCO_3$).

In the oxidant treatment, an etching rate v1 of an agent such as an oxidant or an acid for use in etching a material such as the particles 18 and/or 109 or components such as butadiene components, is higher than an etching rate v2 of an agent such as an oxidant or an acid for use in etching the epoxy resin that contains the material (v1>v2). Thus, on the surface of an insulating layer containing butadiene components and epoxy resin, exposed butadiene components are more etched away by an oxidant than exposed epoxy resin. The surface portions from which the butadiene components are removed thus turn into concave sections and hence the surface of the insulating layer becomes rough.

The inventors of the present invention devoted themselves to perform experiments and found out that the content of butadiene components in an insulating layer in the range from 1% to 30% by weight offers 8 N/cm or higher, in peel strength for the insulating layer and a plated layer formed thereon. It was further found out that the content of butadiene components in an insulating layer in the range from 3% to 15% by weight offers 12 N/cm or higher, respectively, in peel strength for the insulating layer and a plated layer formed thereon.

Any components that exhibit an etching rate different from v2 of an oxidant for use in etching epoxy resin can be added to the insulative resin inks 15 and/or 101, instead of butadiene components.

Moreover, the insulative resin inks 15 and/or 101 may be added with particles made of calcium carbonate ($CaCO_3$) mixed with butadiene components. An alternative to such an insulative resin ink with butadiene components is a mixed resin ink made of an oxidant mixed with at least two types of resin exhibiting different etching rates.

Concerning the particles 18 and 109 made of calcium carbonate ($CaCO_3$) and contained in the insulative resin inks 15 and 101, respectively, the present invention is not limited to the range from 1 μm to 10 μm and about 10% by weight for the diameter range and content, respectively, defined in the first to third embodiments.

The inventors of the present invention devoted themselves to perform experiments and found out that the ranges from 1 μm to 20 μm and 1% to 30% by weight for the diameter range and content, respectively, for the particles 18 and 109 mentioned above offer sufficient adhesiveness to the plated layers and insulating layers at their interfaces, like discussed in the first to third embodiments.

Also found out are that an insulating layer made of an insulative resin ink having particles with the diameter and content in the ranges from 1 μm to 20 μm and 1% to 30% by weight, respectively, exhibits higher adhesiveness than an insulating layer made of an insulative resin ink having a smaller diameter and/or content than those in the ranges, and also exhibits higher stiffness and adhesiveness than an insulating layer made of an insulative resin ink having a greater diameter and/or content than those in the ranges.

The present invention is not limited to calcium carbonate ($CaCO_3$) for the particles 18 and 109 mentioned in the first to third embodiments. Any components soluble to acid, such as, sulfuric acid, that can provide concave sections on an insulating layer in the oxidant treatment in the embodiments, offer sufficient adhesiveness to a plated layer and an insulating layer at their interface.

Furthermore, the present invention is not limited to the insulative resin inks 15 and 101 in forming the second insulating layers 17a and 17b and the fourth insulating layers 153a and 153b, respectively. An alternative to the insulative resin inks 15 and/or 101 is a B-staged (half-cured) resin sheet soluble to acid, such as, sulfuric acid, in oxidant treatment, containing particles each having a diameter in the range from 1 μm to 20 μm and a content in the range from 1% to 30% by weight.

Another modification is a dual-layer printed wiring board having solder resists with specific patterns on the double-sided wiring board 125 having the wiring layers 121 and 122 on both sides, as shown in FIG. 22.

A thinner insulating layer with no sheet-type reinforcing material, such as, the second insulating layers 17a and 17b in the first embodiment, gives higher occupying ratio to other sheet-type reinforcing materials contained in a produced printed wiring board, thus offering higher stiffness to the wiring board. Nevertheless, such a thinner insulating layer suffers a weaker mechanical strength. The thickness of such a thinner insulating layer is thus preferably in the range from 5 µm to 20 µm.

As disclosed in detail, the present invention achieves finer wiring patterns and also higher adhesiveness between a wiring layer and an insulating layer in a multilayer build-up printed wiring board, even though subtractive etching or semi-additive processing is employed.

What is claimed is:

1. A printed wiring board comprising:
    an insulative substrate;
    a first wiring layer formed on at least one surface of the substrate;
    an insulating layer having a dual-layer structure comprising (i) a first insulating layer formed on the first wiring layer, the first insulating layer being formed of a cured insulative sheet made of a high-stiffness sheet-type reinforcing material containing resin, and (ii) a second insulating layer formed on the first insulating layer, the second insulating layer having concave sections and being formed of an insulating resin ink; and
    a second wiring layer made of a conductive material and formed on the insulating layer;
    wherein the insulating layer having the dual-layer structure is provided between the first wiring layer and the second wiring layer;
    wherein the first and second wiring layers are electrically connected to each other through at least one hole having a bottom; and
    wherein the second wiring layer is united with the second insulating layer at an interface of the second insulating layer with the second wiring layer, such that the conductive material of the second wiring layer is injected into the concave sections provided in the second insulating layer at the interface.

2. The printed wiring board according to claim 1, wherein the sheet-type reinforcing material comprises one of: glass cloth, glass nonwoven fabric, aramid cloth, and aramid nonwoven fabric.

* * * * *